United States Patent
Sakurai et al.

(10) Patent No.: US 6,610,794 B1
(45) Date of Patent: Aug. 26, 2003

(54) POLYMIDE/POLYARYLATE RESIN COMPOSITION AND MOLDED PRODUCT THEREOF

(75) Inventors: Tomonori Sakurai, Kyoto (JP); Jiro Sadanobu, Iwakuni (JP); Takashi Ito, Iwakuni (JP); Naoya Saito, Shizuoka (JP); Shintaro Shimada, Iwakuni (JP)

(73) Assignee: Teijin Limited, Osaka (JP)

( * ) Notice: Subject to any disclaimer, the term of this patent is extended or adjusted under 35 U.S.C. 154(b) by 0 days.

(21) Appl. No.: 09/857,430

(22) PCT Filed: Dec. 2, 1999

(86) PCT No.: PCT/JP99/06770

§ 371 (c)(1), (2), (4) Date: Sep. 20, 2001

(87) PCT Pub. No.: WO00/32691

PCT Pub. Date: Jun. 8, 2000

(30) Foreign Application Priority Data

Dec. 2, 1998 (JP) .............................. 10-342980

(51) Int. Cl.$^7$ .............................................. C08F 283/04
(52) U.S. Cl. ........................ 525/425; 525/433; 525/434; 525/436
(58) Field of Search ................................ 525/425, 436, 525/433, 434

(56) References Cited

U.S. PATENT DOCUMENTS

| | | | | |
|---|---|---|---|---|
| 4,250,279 A | | 2/1981 | Robeson et al. ............. | 525/425 |
| 4,430,484 A | | 2/1984 | Quinn | |
| 4,879,354 A | | 11/1989 | Harris et al. ................ | 525/425 |
| 5,280,101 A | * | 1/1994 | Koning et al. ............... | 528/229 |
| 5,387,639 A | | 2/1995 | Sybert et al. ................ | 524/537 |
| 6,114,472 A | * | 9/2000 | Matsuki et al. ............. | 525/425 |

FOREIGN PATENT DOCUMENTS

| | | | |
|---|---|---|---|
| EP | 256761 | 2/1988 | |
| EP | 0 522 649 A1 | 1/1993 | |
| EP | 0 117 326 | 9/1994 | ........... C08L/79/08 |
| EP | 0 117 327 | 9/1994 | ........... C08L/79/08 |
| EP | 0 881 263 A1 | 12/1998 | |
| JP | 10-182872 | 7/1998 | ........... C08K/3/04 |
| WO | 98/23682 | 6/1998 | ........... C08L/67/02 |

* cited by examiner

Primary Examiner—Ana Woodward
(74) Attorney, Agent, or Firm—Sughrue Mion, PLLC

(57) ABSTRACT

A resin composition comprising:
a polyimide comprising a recurring unit represented by the following formula (1):

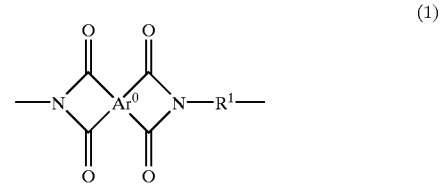

wherein $Ar^0$ is an aromatic hydrocarbon group having 6 to 15 carbon atoms, and $R^1$ is at least one group selected from the group consisting of the divalent residual group obtained by removing two amino groups from an aliphatic diamine having 2 to 30 carbon atoms and the divalent residual group obtained by removing two amino groups from an alicyclic diamine having 4 to 30 carbon atoms, and a polyarylate or polyester carbonate.

This resin composition has excellent heat resistance, dimensional stability and transparency. Particularly, the resin composition having excellent transparency is advantageously used as a molded product such as a flexible printed board.

33 Claims, No Drawings

POLYIMIDE/POLYARYLATE RESIN COMPOSITION AND MOLDED PRODUCT THEREOF

FIELD OF THE INVENTION

The present invention relates to a novel resin composition comprising a polyarylate and/or polyester carbonate and a polyimide and to a molded product thereof More specifically, it relates to a novel resin composition which comprises a polyarylate and/or polyester carbonate and a polyimide and has excellent heat resistance, moldability and dimensional stability and to a molded product thereof.

PRIOR ART

Polyimides typified by KAPTON are used in a wide variety of industrial fields such as an electronic field thanks to their high heat resistance. However, the polyimides generally have poor moldability and low dimensional stability due to their high hygroscopicity, and are inferior in optical transparency because they are colored red brown. Meanwhile, polyarylates and polycarbonates are materials having excellent dimensional stability against moisture absorption and excellent optical transparency. However, as these materials have a glass transition temperature of 200° C. at best, they have limitation in heat resistance. Therefore, solder resistance cannot be expected from these materials and the materials do no have satisfactory performance as the next generation optical material expected for use in photoelectric printed boards.

A blend of a polyarylate and a polyether imide is disclosed by EP117326A and EP33011B/U.S. Pat. No. 4,250,279 as attempts to combine the characteristic properties of a polyimide and a polyarylate. Out of these, EP33011B/U.S. Pat. No. 4,250,279 reports that the blend is not always transparent, depending on the ratio of the polyarylate to the polyimide. EP256761A/U.S. Pat. No. 5,084,526 and U.S. Pat. No. 4,879,354 disclose a compatible blend comprising a polyarylate and a polycarbonoimide (aromatic ether amide imide polymer) which contains an aromatic diamine as a diamine component. Although this blend is amorphous, as the contained aromatic ether amide imide has a structure derived from a bisphenol A derivative, the blend has a low Tg of 220 to 270° C. and has limitation in improving the heat resistance of the polyarylate while retaining compatibility. Therefore, a large amount of the aromatic ether amide imide is required to improve heat resistance, thereby sharply increasing melt viscosity and making molding difficult. EP594386A1/U.S. Pat. No. 5,387,639 discloses a thermoplastic molding composition which comprises a polyester carbonate resin and/or polyarylate resin and polyether imide resin. EP117327A discloses a composition which is a blend of a polyarylate, polyether imide and thermoplastic polymer compatibile with these.

WO 98/23682 discloses a thermoplastic resin composition which comprises a polyimide and an aromatic polyester.

The above blend compositions have a glass transition temperature Tg of 220° C. at best and a blend composition having sufficiently high resistance to soldering heat has not been ever reported.

Studies on a blend of a liquid crystal polyarylate and a polyimide (Polymer vol. 36, pp. 259–266, 1995) have been reported but the blend is a heterogeneous material which is a non-compatible or partly compatible blend and the reported blend compositions are unsatisfactory in terms of heat resistance.

SUMMARY OF THE INVENTION

It is an object of the present invention to provide a novel resin composition which comprises a polyarylate and a polyimide.

It is another object of the present invention to provide a resin composition as a novel heat resistant material having excellent heat resistance, moldability and dimensional stability.

It is still another object of the present invention to provide a resin composition which has excellent heat resistance and transparency.

It is a further object of the present invention to provide a molded product of the above resin composition of the present invention.

Other objects and advantages of the present invention will become apparent from the following description.

According to the present invention, firstly, the above objects and advantages of the present invention are attained by a resin composition comprising:

(A) a polyimide comprising a recurring unit represented by the following formula (1):

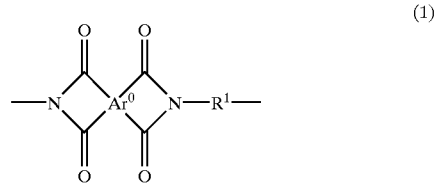

wherein $Ar^0$ is an aromatic hydrocarbon group having 6 to 15 carbon atoms, and $R^1$ is at least one group selected from the group consisting of a divalent residual group obtained by removing two amino groups from an aliphatic diamine having 2 to 30 carbon atoms and a divalent residual group obtained by removing two amino groups from an alicyclic diamine having 4 to 30 carbon atoms, and (B) at least one polymer selected from the group consisting of a polyarylate comprising at least one recurring unit selected from the group consisting of a recurring unit represented by the following formula (2-1):

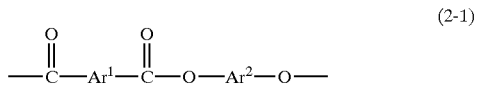

wherein $Ar^1$ is an aromatic hydrocarbon group having 6 to 18 carbon atoms and $Ar^2$ is an aromatic hydrocarbon group having 6 to 30 carbon atoms or a combination of the aromatic hydrocarbon group and an aliphatic hydrocarbon group having 2 to 10 carbon atoms, and a recurring unit represented by the following formula (2-2):

wherein $Ar^3$ is an aromatic hydrocarbon group having 6 to 18 carbon atoms, and a polyester carbonate comprising one of the above recurring units and a recurring unit represented by the following formula (2-3):

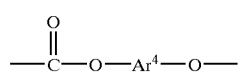
(2-3)

wherein Ar⁴ is an aromatic hydrocarbon group having 6 to 30 carbon atoms, the amount of the polyimide (A) being 0.05 to 99.95 wt % and the amount of the polymer (B) being 99.95 to 0.05 wt % based on the total weight of the polyimide (A) and the polymer (B).

Secondly, the above objects and advantages of the present invention are attained by a molded product of the above resin composition of the present invention. The molded product is an article used for a specific purpose and having a three-dimensional form, and includes films and sheets.

DETAILED DESCRIPTION OF THE INVENTION

The polyimide used in the present invention consists of a recurring unit represented by the above formula (1).

In the formula (1), $Ar^0$ is an aromatic hydrocarbon group having 6 to 15 carbon atoms. Examples of the aromatic hydrocarbon group include groups represented by the following formulas:

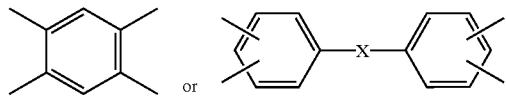

wherein X is a single bond, carbonyl group, sulfonyl group, alkylene group having 1 to 3 carbon atoms or haloalkylene group having 1 to 3 carbon atoms.

They may be existent in the polymer chain alone or in combination of two or more.

Out of these, groups represented by the following formulas are preferred:

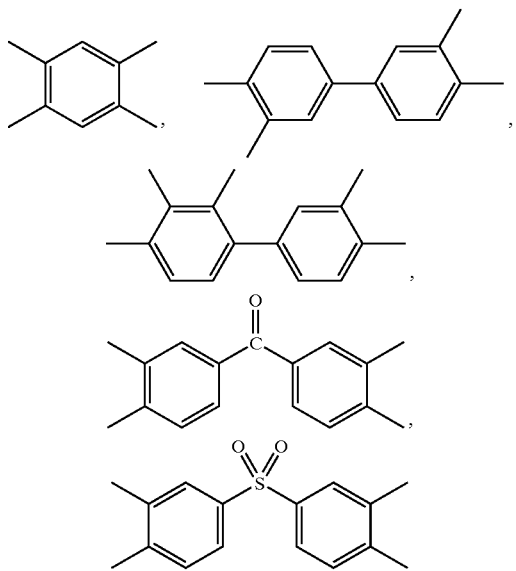

groups represented by the following formulas are more preferred:

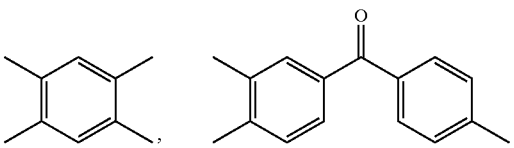

and groups represented by the following formula are particularly preferred:

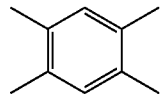

In the above formula (1), $R^1$ is the divalent residual group obtained by removing two amino groups from an aliphatic diamine having 2 to 30 carbon atoms or the divalent residual group obtained by removing two amino groups from an alicyclic diamine having 4 to 30 carbon atoms. $R^1$ may be alone or in combination of two or more selected from these residual groups.

Examples of the residual group obtained by removing two amino groups from an aliphatic diamine having 2 to 30 carbon atoms include groups represented by the following formula:

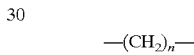

wherein n is a number of 2 to 30, such as ethylene, propylene, trimethylene, tetramethylene, dimethylpropylene, hexamethylene, octamethylene, decamethylene, undecamethylene, dodecamethylene, eicosamethylene and triacontamethylene; and 2,2,4-trimethylhexamethylene diamine and 2,4,4-trimethylhexamethylene diamine. Another example is

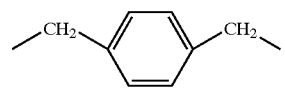

Out of these, the groups represented by the above formula $-(CH_2)_n-$ and by the formula

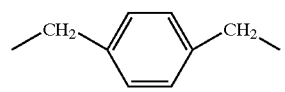

are preferred.

Examples of the divalent residual group obtained by removing two amino groups from an alicyclic diamine having 4 to 30 carbon atoms include groups represented by the following formulas:

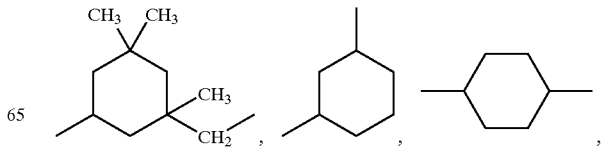

-continued

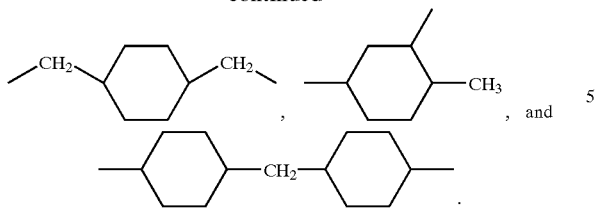
, and

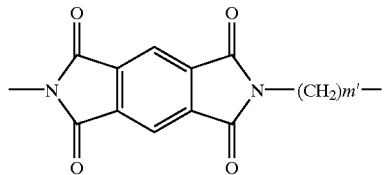

Out of these, groups represented by the following formulas are preferred:

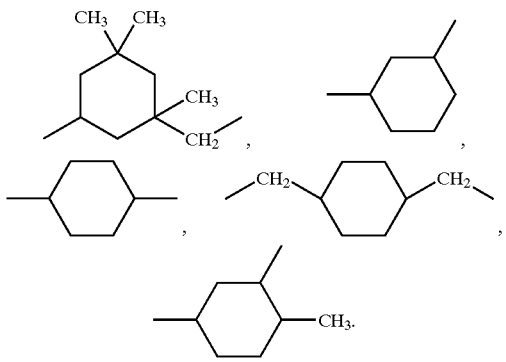

In the present invention, the recurring unit represented by the above formula (1) is preferably a recurring unit represented by the following formula (1)-1:

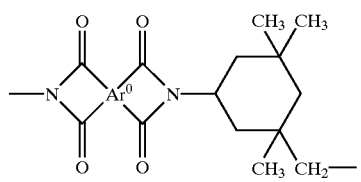
(1)-1 wherein $Ar^0$ is as defined in the above formula (1), or a recurring unit represented by the following formula (1)-2:

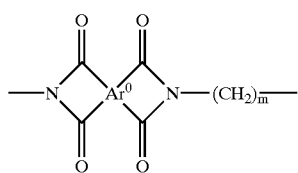
(1)-2 wherein $Ar^0$ is as defined in the above formula (1), and m is an integer of 9 to 12, particularly preferably a recurring unit represented by the following formula (1)-1-1:

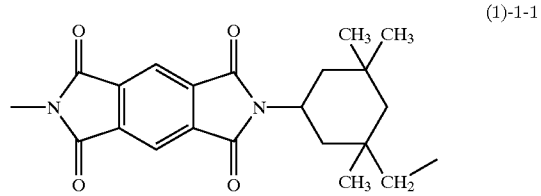
(1)-1-1 or a recurring unit represented by the following formula (1)-2-1:

(1)-2-1 wherein m' is 10 and/or 12.

The above polyimide may be produced by known methods. The methods include one in which a polyamide acid is obtained from a tetracarboxylic dianhydride as a raw material capable of deriving the above $Ar^0$ and a diamine capable of deriving the above $R^1$ and heated to close the ring thereof, one in which ring closure is chemically carried out using an acid anhydride and a chemical ring closing agent such as pyridine, carbodiimide or triphenyl phosphate, and one in which the above tetracarboxylic dianhydride and a diisocyanate capable of deriving the above $R^1$ are polymerized by heating and decarboxylation.

Examples of the tetracarboxylic dianhydride used in the above methods include pyrromellitic dianhydride, 3,3',4,4'-benzophenone tetracarboxylic dianhydride, 3,3'-4,4'-biphenyltetracarboxylic dianhydride and 3,3',4,4'-diphenylsulfone tetracarboxylic dianhydride.

Examples of the diamine include ethylenediamine, 1,2-propanediamine, 1,3-propanediamine, 2,2-dimethyl-1,3-propanediamine, 1,6-hexamethylenediamine, 1,8-octamethylenediamine, 1,10-decamethylenediamine, 1,11-undecamethylenediamine, 1,12-dodecamethylenediamine, 2,2,4-trimethylhexamethylenediamine, 2,4,4-trimethylhexamethylenediamine, isophoronediamine, 1,3-cyclohexanediamine, 1,4-cyclohexanediamine, 1,4-cyclohexanedimethylamine, 4-methyl-1,3-cyclohexanediamine and paraxylylenediamine.

Examples of the diisocyanate component include ethylene diisocyanate, 1,2-propane diisocyanate, 1,3-propane diisocyanate, 2,2-dimethyl-1,3-propane diisocyanate, 1,6-hexamethylene diisocyanate, 1,8-octamethylene diisocyanate, 1,10-decamethylene diisocyanate, 1,11-undecamethylene diisocyanate, 1,12-dodecamethylene diisocyanate, 2,2,4-trimethylhexamethylene diisocyanate, 2,4,4-trimethylhexamethylene diisocyanate, isophorone diisocyanate, 1,3-cyclohexane diisocyanate, 1,4-cyclohexane diisocyanate, 1,4-cyclohexane dimethylisocyanate, 4-methyl-1,3-cyclohexane diisocyanate and paraxylylene diisocyanate.

The molecular weight of the polyimide in the present invention is not particularly limited. Generally speaking, when the polyimide dissolves in a mixed solvent of phenol/tetrachloroethane (weight ratio of 6/4), it preferably has an intrinsic viscosity measured at a temperature of 35° C. and a concentration of 1.2 g/dl of 0.05 to 12 dl/g. The lower limit is more preferably 0.07, much more preferably 0.10 and the upper limit is more preferably 10.

The polyarylate used in the present invention consists of at least one of a recurring unit represented by the above formula (2-1) and a recurring unit represented by the above formula (2-2).

In the above formula (2-1), $Ar^1$ is an aromatic hydrocarbon group having 6 to 18 carbon atoms. The aromatic hydrocarbon group is a group represented by the following formula:

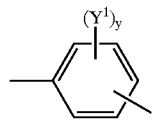

wherein $Y^1$ is a group selected from the group consisting of an aliphatic hydrocarbon group having 1 to 6 carbon atoms, alicyclic hydrocarbon group having 6 to 12 carbon atoms and halogen atom, and y is a number of 0 to 4, with the proviso that when y is 2 to 4, $Y^1$'s may be the same or different, or a group represented by the following formula:

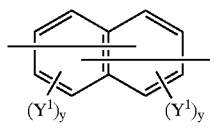

wherein $Y^1$ and y are as defined hereinabove, with the proviso that $Y^1$'s may be the same or different, the total of two y's is not larger than 6, and two bonding hands may come out from any position excluding the peri-position of a naphthalene ring.

The aliphatic hydrocarbon group represented by $Y^1$ in the above formula has 1 to 6 carbon atoms, as preferably exemplified by alkyl groups having 1 to 6 carbon atoms such as methyl, ethyl, propyl, butyl, pentyl and hexyl. The alkyl groups may be linear or branched (for example, neopentyl group) The alicyclic hydrocarbon group represented by $Y^1$ has 6 to 12 carbon atoms, as exemplified by cyclohexyl, decalyl and cyclohexyl cyclohexyl (dodecahydroxybiphenylyl). Further, the halogen atom represented by $Y^1$ is preferably fluorine, chlorine or bromine y is an integer of 0 to 6. When y is an integer of 2 to 4, $Y^1$'s may be the same or different. In the latter formula, the total of two y's is not larger than 6. Preferred examples of the aromatic hydrocarbon group having 6 to 18 carbon atoms represented by $Ar^1$ include 1,4-phenylene, 1,3-phenylene, 2,6-naphthylene, 2,7-naphthylene and 2,3-naphthylene.

Out of these, 1,4-phenylene, 1,3-phenylene and 2,6-naphthylene are more preferred.

$Ar^1$ may be alone or in combination of the above groups, particularly preferably a combination of 1,4-phenylene and 1,3-phenylene.

In the above formula (2-1), $Ar^2$ is an aromatic hydrocarbon group having 6 to 30 carbon atoms or a combination of the aromatic hydrocarbon group and an aliphatic hydrocarbon group having 2 to 10 carbon atoms. The aromatic hydrocarbon group having 6 to 30 carbon atoms is a group represented by the following formula:

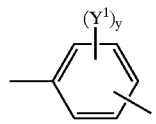

wherein $Y^1$ is a group selected from the group consisting of an aliphatic hydrocarbon group having 1 to 6 carbon atoms, alicyclic hydrocarbon group having 6 to 12 carbon atoms and halogen atom, and y is a number of 0 to 4, with the proviso that when y is 2 to 4, $Y^1$'s may be the same or different, or a group represented by the following formula:

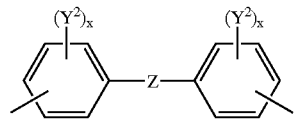

wherein Z is a group selected from the group consisting of a single bond, ether bond, carbonyl group, sulfonyl group, aliphatic hydrocarbon group having 1 to 10 carbon atoms, haloaliphatic hydrocarbon group having 1 to 10 carbon atoms, alicyclic hydrocarbon group having 6 to 10 carbon atoms and haloalicyclic hydrocarbon group having 6 to 10 carbon atoms, $Y^2$'s are each independently an aliphatic hydrocarbon group having 1 to 6 carbon atoms, alicyclic hydrocarbon group having 6 to 12 carbon atoms or halogen atom, and x's are each independently a number of 0 to 4.

Examples of the phenylene group and substituted phenylene group in the former formula are the same as those enumerated for $Ar^1$.

In the latter formula, examples of the aliphatic hydrocarbon group having 1 to 10 carbon atoms and the alicyclic hydrocarbon group having 6 to 10 carbon atoms represented by Z and $Y^2$ are the same divalent groups as those enumerated for $Y^1$ in $Ar^1$, such as 1,2-ethylene group and 1,4-cyclohexylene group. Examples of the haloaliphatic hydrocarbon group having 1 to 10 carbon atoms and haloalicyclic hydrocarbon group having 6 to 12 carbon atoms are halo-substitution products of the above aliphatic hydrocarbon groups and alicyclic hydrocarbon groups. Preferred examples of the halo-substitution products and halogen atom represented by $Y^2$ include fluorine, chlorine and bromine. Two x's are each independently a number of 0 to 4.

The aliphatic hydrocarbon group having 2 to 10 carbon atoms represented by $Ar^2$ is preferably a group having no tertiary carbon atom such as methylene, ethylene, trimethylene, tetramethylene, hexamethylene, decamethylene or neopentylene. Neopentylene is particularly preferred. The aliphatic hydrocarbon group is used in combination with the above aromatic hydrocarbon group having 6 to 30 carbon atoms.

In the above formula (2-2), $Ar^3$ is an aromatic hydrocarbon group having 6 to 18 carbon atoms. The aromatic hydrocarbon group having 6 to 18 carbon atoms is, for example, a group represented by the following formula:

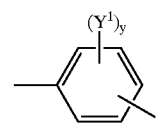

wherein $Y^1$ is a group selected from the group consisting of an aliphatic hydrocarbon group having 1 to 6 carbon atoms, alicyclic hydrocarbon group having 6 to 12 carbon atoms and halogen atom, and y is a number of 0 to 4, with the proviso that when y is 2 to 4, $Y^1$'s may be the same or different.

Examples of the aromatic hydrocarbon group having 6 to 18 carbon atoms are the same as those enumerated for $Ar^1$. Out of these, a 1,4-phenylene group is particularly preferred.

The polyarylate in the present invention may be polymerized by conventionally known methods. The methods include one in which an acid chloride derived from a dicarboxylic acid and a diphenol are polycondensed in the presence of a methylene chloride solvent, one in which a diphenyl ester derived from a dicarboxylic acid and a diphenol are melt polymerized in the presence of a catalyst, one in which a monooxy monocarboxylic acid ester is polycondensed in the presence of an alkali, and one in which a diphenyl dicarboxylate, diphenol and monooxy monocarboxylic acid ester are polycondensed in the presence of a catalyst.

Examples of the above dicarboxylic acid include aromatic dicarboxylic acids such as terephthalic acid, isophthalic acid, 2-methylterephthalic acid, 4-methylisophthalic acid, 2-chloroterephthalic acid, 2,6-naphthalenedicarboxylic acid and 2,7-naphthalenedicarboxylic acid.

Examples of the monooxy monocarboxylic acid include 4-oxybenzoic acid and 6-oxynaphthoic acid.

Examples of the diphenol include
2,2-bis-(4-hydroxyphenyl)propane,
bis-(4-hydroxyphenyl)methane,
1,1-bis-(4-hydroxyphenyl)ethane,
1,2-bis-(4-hydroxyphenyl)ethane,
1,3-bis-(4-hydroxyphenyl)propane,
bis-(2-hydroxyphenyl)methane,
1,1-bis-(2-hydroxyphenyl)ethane,
1,2-bis-(2-hydroxyphenyl)ethane,
2,2-bis-(2-hydroxyphenyl)propane,
1,3-bis-(2-hydroxyphenyl)propane,
bis-(4-hydroxy-2,6-dimethyl-3-methoxyphenyl)methane,
1,1-bis-(4-hydroxy-2,6-dimethyl-3-methoxyphenyl)ethane,
1,2-bis-(4-hydroxy-2,6-dimethyl-3-methoxyphenyl)ethane,
2,2-bis-(4-hydroxy-2,6-dimethyl-3-methoxyphenyl)propane,
1,3-bis-(4-hydroxy-2,6-dimethyl-3-methoxyphenyl)propane,
bis-(4-hydroxyl-2-chlorophenyl)methane,
1,1-bis-(4-hydroxy-2-chlorophenyl)ethane,
1,2-bis-(4-hydroxy-2-chlorophenyl)ethane,
2,2-bis-(4-hydroxy-2-chlorophenyl)propane,
1,3-bis-(4-hydroxy-2-chlorophenyl)propane,
bis-(3-methyl-4-hydroxyphenyl)methane,
1,1-bis-(3-methyl-4-hydroxyphenyl)ethane,
1,2-bis-(3-methyl-4-hydroxyphenyl)ethane,
2,2-bis-(3-methyl-4-hydroxyphenyl)propane,
1,3-bis-(3-methyl-4-hydroxyphenyl)propane,
2,2-bis-(3-isopropyl-4-hydroxyphenyl)propane,
2,2-bis-(2-isopropyl-4-hydroxyphenyl)propane and
p-dihydroxybenzene.

The molecular weight of the polyarylate in the present invention is not particularly limited but the intrinsic viscosity measured in a mixed solvent of phenol/tetrachloroethane (weight ratio of 6/4) at a temperature of 35° C. and a concentration of 1.2 g/dl of the polyarylate is preferably 0.1 to 10.0 dl/g. The lower limit is more preferably 0.15, much more preferably 0.25 and the upper limit is more preferably 7.

The polyester carbonate used in the present invention further contains a recurring unit represented by the above formula (2-3).

In the above formula (2-3), $Ar^4$ is an aromatic hydrocarbon group having 6 to 30 carbon atoms. The aromatic hydrocarbon group having 6 to 30 carbon atoms is, for example, a group represented by the following formula:

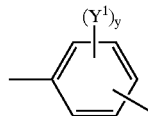

wherein $Y^1$ is a group selected from the group consisting of an aliphatic hydrocarbon group having 1 to 6 carbon atoms, alicyclic hydrocarbon group having 6 to 12 carbon atoms and halogen atom, and y is a number of 0 to 4, with the proviso that when y is 2 to 4, $Y^1$'s may be the same or different, and/or a group represented by the following formula:

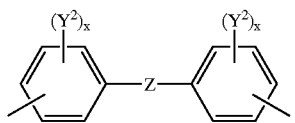

wherein Z is a group selected from the group consisting of a single bond, ether bond, carbonyl group, sulfonyl group, aliphatic hydrocarbon group having 1 to 10 carbon atoms, haloaliphatic hydrocarbon group having 1 to 10 carbon atoms, alicyclic hydrocarbon group having 6 to 10 carbon atoms and haloalicyclic hydrocarbon group having 6 to 10 carbon atoms, $Y^2$'s are each independently an aliphatic hydrocarbon group having 1 to 6 carbon atoms, alicyclic hydrocarbon group having 6 to 12 carbon atoms or halogen atom, and x's are each independently a number of 0 to 4.

Examples of the aromatic hydrocarbon groups are the same as those enumerated for $Ar^2$ in the formula (2-1).

The above polyester carbonate in the present invention can be produced by a known method, for example, one in which an aromatic dihydroxy compound and phosgene are polycondensed in the presence of an alkali and then the obtained polycondensate is melt kneaded with the above polyarylate, or one in which a dicarboxylic acid, aromatic dihydroxy compound and diphenyl carbonate are polycondensed in the presence of a catalyst.

The molecular weight of the polyester carbonate in the present invention is not particularly limited but the intrinsic viscosity measured in a mixed solvent of phenol/tetrachloroethane (weight ratio of 6/4) at a temperature of 35° C. and a concentration of 1.2 g/dl of the polyester carbonate is preferably 0.1 to 10.0 dl/g. The lower limit is more preferably 0.15, much more preferably 0.25 and the upper limit is more preferably 7.

The resin composition in the present invention comprises 0.05 to 99.95 wt % of the polyimide (A) and 99.95 to 0.05 wt % of the polymer (B) based on the total weight of the polymer (B) and the polyimide (A). When the amount of the polymer (B) is smaller than 0.05 wt %, an effect may not be obtained by adding the polyimide (A) to the polymer (B) and heat resistance may not be improved fully. When the amount of the polymer (B) is larger than 99.95 wt %, an effect may not be obtained by blending the polymer (B) and the moisture absorption and water absorption properties of the polyimide (A) may not be improved.

Based on the same standard, the amount of the polymer (B) is preferably 2 to 95 wt %, more preferably 5 to 90 wt %. Therefore, the amount of the polyimide (A) is preferably 98 to 5 wt %, more preferably 95 to 10 wt %.

It has been revealed that the above resin composition of the present invention having the following composition is particularly excellent in transparency.

The polyamide (A) comprises a recurring unit represented by the following formula (1)-1:

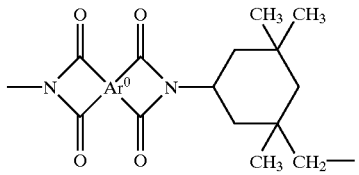

(1)-1 wherein Ar⁰ is as defined in the above formula (1), and the polymer (B) is a polyarylate which comprises a recurring unit represented by the following formula (2-1)-1:

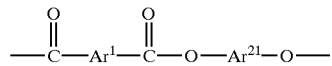

(2-1)-1 wherein $Ar^1$ is as defined in the above formula (2-1), and $Ar^{21}$ is at least one group selected from the group consisting of groups represented by the following formula:

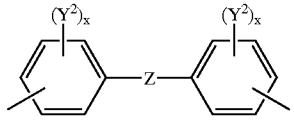

wherein Z is a group selected from the group consisting of a single bond, ether bond, carbonyl group, sulfonyl group, aliphatic hydrocarbon group having 1 to 10 carbon atoms, haloaliphatic hydrocarbon group having 1 to 10 carbon atoms, alicyclic hydrocarbon group having 6 to 10 carbon atoms and haloalicyclic hydrocarbon group having 6 to 10 carbon atoms, $Y^2$'s are each independently an aliphatic hydrocarbon group having 1 to 6 carbon atoms, alicyclic hydrocarbon group having 6 to 12 carbon atoms or halogen atom, and x's are each independently a number of 0 to 4.

The above polyarylate comprises more preferably a recurring unit represented by the following formula (2-1)-2:

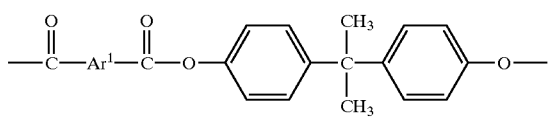

(2-1)-2 wherein $Ar^1$ is as defined in the above formula (2-1), particularly preferably a recurring unit of the above formula (2-1)-2 in which $Ar^1$ is a 1,4-phenylene group and/or 1,3-phenylene group.

The above resin composition having excellent transparency has a light absorption coefficient at a wavelength of 400 to 800 nm of preferably 200 cm⁻¹ or less, more preferably 100 cm⁻¹ or less, particularly preferably 0 to 50 cm⁻¹. When this value is larger than 200 cm⁻¹, coloring becomes marked. The expression "light absorption coefficient" as used herein means a coefficient a based on the condition that light transmittance follows Lambert's law represented by the following equation:

$I/I_0 = \exp(-\alpha d)$ wherein I is the intensity of transmitted light at a measurement wavelength, $I_0$ is the intensity of incident light, and d is the thickness of a resin composition (unit: cm).

It has also been found that the resin composition of the present invention having the following composition is particularly excellent in transparency.

The polyimide (A) consists of a recurring unit represented by the above formula (1)-1 and the polymer (B) is a polyester carbonate which consists of a recurring unit represented by the following formula (2-1)-1':

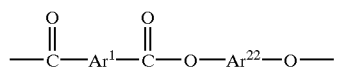

(2-1)-1' wherein $Ar^1$ is as defined in the above formula (2-1), and $Ar^{22}$ is a group represented by the following formula:

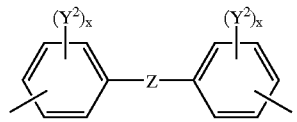

wherein Z is a group selected from the group consisting of a single bond, ether bond, carbonyl group, sulfonyl group, aliphatic hydrocarbon group having 1 to 10 carbon atoms, haloaliphatic hydrocarbon group having 1 to 10 carbon atoms, alicyclic hydrocarbon group having 6 to 10 carbon atoms and haloalicyclic hydrocarbon group having 6 to 10 carbon atoms,. $Y^2$'s are each independently an aliphatic hydrocarbon group having 1 to 6 carbon atoms, alicyclic hydrocarbon group having 6 to 12 carbon atoms or halogen atom, and x's are each independently a number of 0 to 4, and a recurring unit represented by the following formula (2-3)-1:

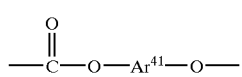

(2-3)-1 wherein $Ar^{41}$ is a group represented by the following formula:

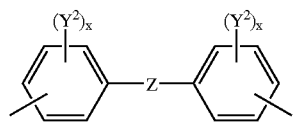

wherein Z is a group selected from the group consisting of a single bond, ether bond, carbonyl group, sulfonyl group, aliphatic hydrocarbon group having 1 to 10 carbon atoms, haloaliphatic hydrocarbon group having 1 to 10 carbon atoms, alicyclic hydrocarbon group having 6 to 10 carbon atoms and haloalicyclic hydrocarbon group having 6 to 10 carbon atoms, $Y^2$'s are each independently an aliphatic hydrocarbon group having 1 to 6 carbon atoms, alicyclic hydrocarbon group having 6 to 12 carbon atoms or halogen atom, and x's are each independently a number of 0 to 4.

The above polyester carbonate preferably comprises a recurring unit represented by the following formula (2-1)-2:

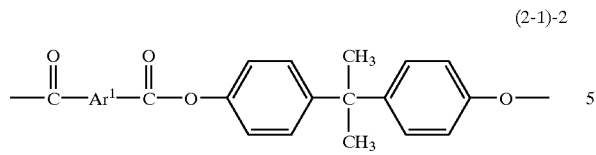
(2-1)-2 wherein $Ar^1$ is as defined in the above formula (2-1), and a recurring unit represented by the following formula (2-3)-1':

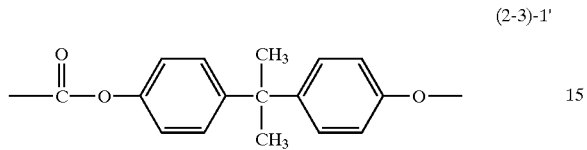
(2-3)-1' particularly preferably comprises a recurring unit of the above formula (2-1)-2 in which $Ar^1$ is a 2,6-naphthylene group and a recurring unit of the above formula (2-3)-1'.

The resin composition which comprises a polyester carbonate and has excellent transparency shows the same value of light absorption coefficient as the above resin composition which comprises a polyarylate and has excellent transparency.

It has been made clear that out of the above resin compositions of the present invention, a resin composition having the following composition is almost opaque without transparency.

The polyimide (A) comprises a recurring unit represented by the following formula (1)-3:

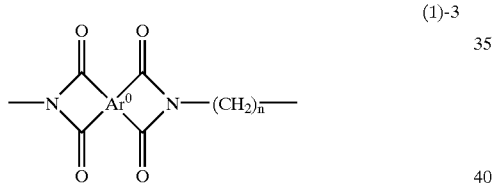
(1)-3 wherein $Ar^0$ is as defined in the above formula (1) and n is a number of 2 to 30, and the polymer (B) is a polyarylate comprising a recurring unit represented by the following formula (2-1)-4:

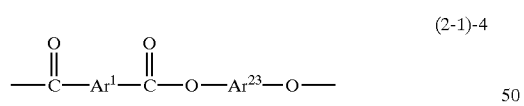
(2-1)-4 wherein $Ar^1$ is as defined in the above formula (2-1), and $Ar^{23}$ is selected from a group represented by the following formula:

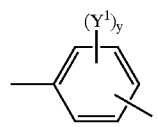

wherein $Y^1$ is a group selected from the group consisting of an aliphatic hydrocarbon group having 1 to 6 carbon atoms, alicyclic hydrocarbon group having 6 to 12 carbon atoms and halogen atom, and y is a number of 0 to 4, with the proviso that when y is 2 to 4, $Y^1$'s may be the same or different, and a group represented by the following formula:

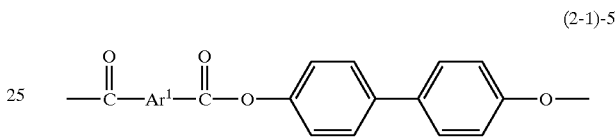

wherein Z is a group selected from the group consisting of a single bond, ether bond, carbonyl group, sulfonyl group, aliphatic hydrocarbon group having 1 to 10 carbon atoms, haloaliphatic hydrocarbon group having 1 to 10 carbon atoms, alicyclic hydrocarbon group having 6 to 10 carbon atoms and haloalicyclic hydrocarbon group having 6 to 10 carbon atoms, $Y^2$'s are each independently an aliphatic hydrocarbon group having 1 to 6 carbon atoms, alicyclic hydrocarbon group having 6 to 12 carbon atoms or halogen atom, and x's are each independently a number of 0 to 4.

The above polyarylate preferably comprises a recurring unit represented by the following formula (2-1)-5:

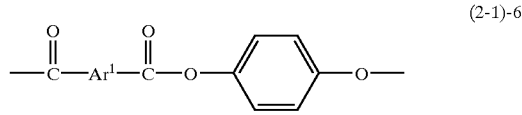
(2-1)-5 wherein $Ar^1$ is as defined in the above formula (2-1), and a recurring unit represented by the following formula (2-1)-6:

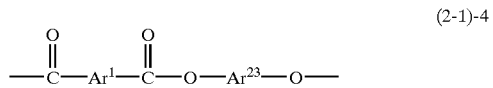
(2-1)-6 wherein $Ar^1$ is as defined in the above formula (2-1), particularly preferably comprises a recurring unit of the formula (2-1)-5 in which $Ar^1$ is a 1,3-phenylene group and a recurring unit of the formula (2-1)-6 in which $Ar^1$ is a 1,3-phenylene group.

Alternatively, the polyimide (A) comprises a recurring unit represented by the following formula (1)-3:

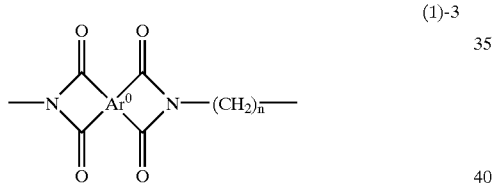
(1)-3 wherein $Ar^0$ is as defined in the above formula (1) and n is a number of 2 to 30, and the polymer (B) is a polyarylate which comprises a recurring unit represented by the following formula (2-1)-4:

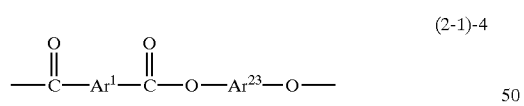
(2-1)-4 wherein $Ar^1$ is as defined in the above formula (2-1), and $Ar^{23}$ is selected from a group represented by the following formula:

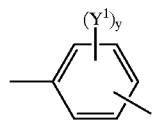

wherein $Y^1$ is a group selected from the group consisting of an aliphatic hydrocarbon group having 1 to 6 carbon atoms, alicyclic hydrocarbon group having 6 to 12 carbon atoms and halogen atom, and y is a number of 0 to 4, with the proviso that when y is 2 to 4, $Y^1$'s may be the same or different, and/or a group represented by the following formula:

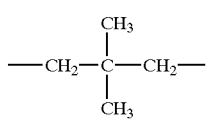

The above polyarylate preferably comprises a recurring unit represented by the following formula (2-1)-7:

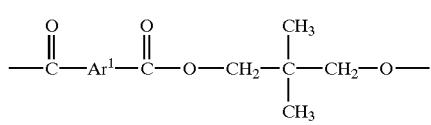

(2-1)-7 wherein $Ar^1$ is as defined in the above formula (2-1), and a recurring unit represented by the following formula

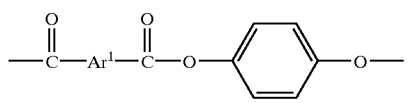

(2-1)-6 wherein $Ar^1$ is as defined in the above formula (2-1), particularly preferably comprises a recurring unit of the above formula (2-1)-7 in which $Ar^1$ is a 1,3-phenylene group and a recurring unit of the above formula (2-1)-6 in which $Ar^1$ is a 1,3-phenylene group.

As described above, the opaque resin composition has a light absorption coefficient at a wavelength of 400 nm to 800 nm of more than 200 $cm^{-1}$.

Also, it has been made clear that the above resin composition of the present invention having the following composition is semi-opaque.

The polyimide (A) comprises a recurring unit represented by the following formula (1)-4:

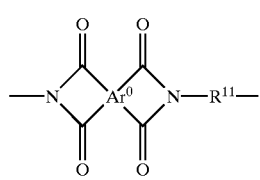

(1)-4 wherein $Ar^0$ is as defined in the above formula (1) and $R^{11}$ is a group represented by the following formula:

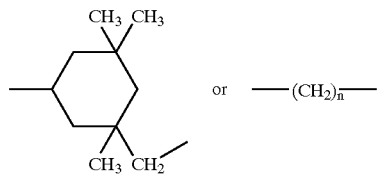

wherein n is an integer of 2 to 30, and the polymer (B) is an polyarylate which comprises a recurring unit represented by the following formula (2-1)-1:

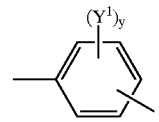

(2-1)-1 wherein $Ar^1$ is as defined in the above formula (2-1) and $Ar^{21}$ is selected from a group represented by the following formula:

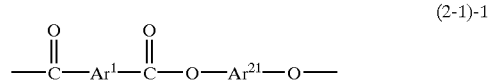

wherein $Y^1$ is a group selected from the group consisting of an aliphatic hydrocarbon group having 1 to 6 carbon atoms, alicyclic hydrocarbon group having 6 to 12 carbon atoms and halogen atom, and y is a number of 0 to 4, with the proviso that when y is 2 to 4, $Y^1$'s may be the same or different, and a group represented by the following formula:

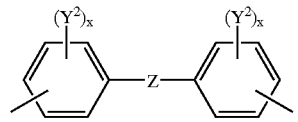

wherein Z is a group selected from the group consisting of an ether bond, carbonyl group, sulfonyl group, aliphatic hydrocarbon group having 1 to 10 carbon atoms, haloaliphatic hydrocarbon group having 1 to 10 carbon atoms, alicyclic hydrocarbon group having 6 to 10 carbon atoms and haloalicyclic hydrocarbon group having 6 to 10 carbon atoms, $Y^2$'s are each independently an aliphatic hydrocarbon group having 1 to 6 carbon atoms, alicyclic hydrocarbon group having 6 to 12 carbon atoms or halogen atom, and x's are each independently a number of 0 to 4.

The above polyarylate preferably comprises a recurring unit represented by the following formula (2-1)-2:

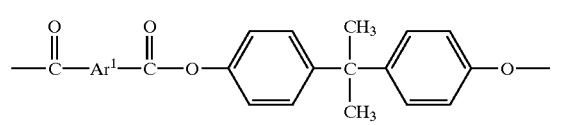

(2-1)-2 wherein Ar¹ is as defined in the above formula (2-1), and a recurring unit represented by the following formula (2-1)-3:

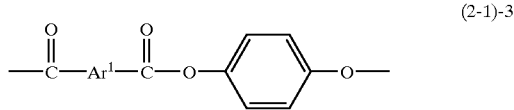

(2-1)-3 wherein Ar¹ is as defined in the above formula (2-1), particularly preferably comprises a recurring unit of the above formula (2-1)-2 in which Ar¹ is a 1,3-phenylene group and a recurring unit of the above formula (2-1)-3 in which Ar¹ is a 1,3-phenylene group.

The polymer (B) and the polyimide (A) in the present invention are preferably soluble in an organic solvent. When they are soluble in an organic solvent, the resin composition of the present invention can be molded even though it has a high transition temperature.

Examples of the organic solvent include hydrocarbon halide solvents such as dichloromethane and chloroform; cyclic ether solvents such as tetrahydrofuran, 1,3-dioxolan and 1,4-dioxane; amide solvents such as N-methyl-2-pyrrolidone, N,N-dimethylacetamide and N,N-dimethylformamide; sulfoxide solvents such as dimethyl sulfoxide; and phenol solvents such as phenol, m-cresol, o-chlorophenol, o-dichlorophenol and 2,4,6-trichlorophenol.

In the resin composition of the present invention, the polymer (B) and the polyimide (A) are preferably compatible with each other. In the resin composition of the present invention, "compatible" can be judged independently (1) in a state where the resin composition is solidified at a temperature (room temperature) lower than the melting points of the polymer (B) and the polyimide (A) or the organic solvent is removed after the components (A) and (B) are dissolved in the organic solvent, that is, in the state of a molded product, (2) in a molten state where the polymer (B) and the polyimide (A) are molten at a temperature higher than their melting points, or (3) a state where the polymer (B) and the polyimide (A) are dissolved in an organic solvent which can dissolve both.

When the composition is used for its differential scanning calorimetry (DSC) or dynamic viscoelasticity measurement in the above state (1), at least one glass transition temperature point of the measured resin composition is observed and shifted to a position close to the glass transition temperature of one of the component (A) and component (B).

When only one point is observed, the known Fox equation a (following equation (1)-1 or (1)-2, 3 and 4 are satisfied:

$$1/TgC = wA(1/TgA) + wB(1/TgB) \quad (1)\text{-}1$$

wherein TgC is the glass transition temperature of the measured composition, TgA and TgB are the glass transition temperatures of the polyimide (A) and the polymer (B), and wA and wB are the weight percentages of the component (A) and the component (B) contained in the composition, respectively.

when TgA>>TgB, TgB<TgC<TgA (1)-2 when TgB>>TgA, TgA<TgC<TgB (1)-3 when TgA=TgB, TgA=TgC=TgB (1)-4 wherein TgC, TgA and TgB are as defined in (1)-1.

When two glass transition temperature points are observed, the following equations (1)-5 and 6 are satisfied.

when TgA>>TgB, TgB<TgC1, TgC2<TgA (1)-5 when TgB>>TgA, TgA<TgC1, TgC2<TgB (1)-6 wherein TgC1 and TgC2 are the glass transition temperatures of the measured composition and TgA and TgB are as defined in (1)-1.

Particularly when the polymer (B) and the polyimide (A) have transparency, the components (A) and (B) are judged as compatible with each other if the composition has the same or higher light transmittance than the component (A) or (B) which has a lower light transmittance than the other.

In the state (2), the components (A) and (B) are judged as compatible with each other when turbidity or liquid-liquid phase separation is not observed and they are transparent.

In the state (3), the components (A) and (B) are judged as compatible with each other when turbidity or liquid-liquid phase separation is not observed by the measurement of light transmittance (80% or more) and haze meter (haze value of 20 or less) of a solution comprising 1 to 20 wt % of the composition.

In the resin composition of the present invention, the glass transition temperature is preferably 220° C. or more, more preferably 260° C. or more. When the glass transition temperature is lower than 220° C., the best use of the heat resistance of the polymer (B) and the polyimide (A) is not made and the characteristic properties of the resin cannot be fully obtained.

As for the method of producing the resin composition of the present invention, when the polymer (B) and the polyimide (A) are both soluble in an organic solvent, they are dissolved and mixed together in the organic solvent which is then removed after shaping. This method is very effective when the glass transition temperature of the resin composition of the present invention is high. When the decomposition of the polymers does not occur and the temperature is within a range at which at least one of the polymers flows, a double-screw extruder may be used to mix these. Further, the resin composition of the present invention may also be produced by mixing together these polymers while polymerizing the polymer (B) in the presence of the polyimide (A).

The resin composition of the present invention may contain various additives as required. The additives include a fibrous reinforcing agent such as glass fiber, metal fiber, aramide fiber, ceramic fiber, potassium titanate whisker or carbon fiber; filler such as talc, calcium carbonate, mica, clay, titanium oxide, aluminum oxide or metal powders; thermal stabilizer or oxidation stabilizer typified by phosphates and phosphites, optical stabilizer, ultraviolet light absorber, lubricant, pigment, flame retardant, flame retardant aid, plasticizer and crystal nucleating agent.

According to the present invention, a resin composition having sufficiently high heat resistance and high glass transition temperature which cannot be obtained by the polyarylate alone and a homogeneous molded product thereof can be obtained with excellent moldability. Similarly, a resin composition having excellent moisture and water absorption properties and heat resistance which cannot be obtained by the polyimide alone and a molded product thereof can be obtained. Further, according to the present invention, a resin composition and a molded product thereof having a desired glass transition temperature which falls within the glass transition temperature ranges of both of the polymers can be designed, making use of the additive property of glass transition temperatures by suitably selecting the glass transition temperatures of the polymer (B) and the polyimide (A) and suitably setting the ratio of the polymer (B) to the polyimide (A).

The resin composition and molded product thereof of the present invention can be applied in flexible solar cell substrates, liquid crystal alignment films, optical substrate materials and optical elements, making use of the above excellent characteristic properties and are therefore of great industrial significance.

The transparent resin composition and molded product thereof can be particularly applied in flexible printed boards, rigid printed boards, photoelectric printed boards, sealing agents, interlayer insulating films and optical waveguide materials, making use of the above excellent characteristic properties and are therefore of great industrial significance.

EXAMPLES

The following examples are provided for the purpose of further illustrating the present invention but are in no way to be taken as limiting.

Method of Measuring Solution Viscosity

The reduced viscosity ($\eta sp/C$) was measured in a mixed solvent of phenol/1,1,2,2-tetrachloroethane (weight ratio of 6/4) at a concentration of 1.2 g/dl and a temperature of 35° C.

The intrinsic viscosity ($[\eta]$) was measured in a mixed solvent of phenol/1,1,2,2-tetrachloroethane (weight ratio of 6/4) at a temperature of 35° C.

Method (1) of Measuring Melt Viscosity

The melt viscosity ($\eta^*$) was measured at 340° C. using a Shimadzu Koka type flow tester having a cap with a nozzle diameter D of 1.0 mm and an L of 5.0 mm.

Method (2) of Measuring Melt Viscosity

The melt viscosity was measured at a temperature of 335° C. and a load of 2.16 kgf with a melt flow rate (MFR) measuring instrument in accordance with JIS K7210.

Method (1) of Measuring Glass Transition Temperature

The peak temperature E" measured at a tensile mode of 1 Hz using the RSA-II viscoelasticity measuring instrument is taken as glass transition temperature (Tg). The glass transition temperature obtained by this measurement method (1) is expressed as Tg (1).

Method (2) of Measuring Glass Transition Temperature

The glass transition temperature (Tg) was measured using the DSC220 differential scanning calorimeter of Seiko Co., Ltd. in a nitrogen gas air stream by elevating the temperature at a rate of 10° C./min. The glass transition temperature obtained by this measurement method (2) is expressed as Tg(2).

Method of Measuring Crystallization Temperature

The crystallization temperature (Tmc) is a value measured by the DSC-7 differential scanning calorimeter when the temperature was elevated to 380° C. at a rate of 20° C./min and then reduced at a rate of 20° C./min.

Method of Measuring Water Absorption Coefficient

The water absorption coefficient was calculated from the following equation by measuring a weight increase after 24 hours of the immersion of a film in distilled water heated at 23.5° C.:

(water absorption coefficient %)=100×$\Delta W/W_0$ wherein $W_0$ is the weight of the film before immersion in distilled water.

Method of Measuring Moisture Absorption Coefficient

The equilibrium moisture absorption coefficient at a relative humidity of 50% and 23° C. was obtained.

Method of Measuring Light Transmittance and Yellowness Index

The yellowness index (expressed as YI in this text) of a film was measured with the Shimadzu UV2400PC in accordance with JIS K7103. The light transmission spectrum of the film was measured with the Shimadzu UV2400PC.

The value $\alpha$ is a light absorption coefficient based on the condition that the light absorption coefficient follows Lambert's law shown by the following equation:

$$I/I_0 = \exp(-\alpha d)$$

wherein I is the intensity of transmitted light at a measurement wavelength, $I_0$ is the intensity of incident light, and d is the thickness of the resin composition (unit: cm).

REFERENCE EXAMPLE 1

221 g (1.3 mols) of isophorone diamine, 283 g (1.3 mols of pyromellitic acid anhydride and a mixed solution consisting of 2 liters of benzyl alcohol/0.5 liter of toluene as a solvent were heated at 180° C. in a 5-liter separable flask equipped with a Dean and Stark unit, cooling tube, stirrer and nitrogen introduction tube to carry out polymerization and ring-closing reactions while distilling water was removed to the outside of a system by the Dean and Stark unit. The amount of the distilling water was 47 ml which was the theoretical amount. The reaction solution was maintained at the same temperature for 4 hours, left to be cooled and added to water when the temperature of the reaction solution was reduced to 80° C., and the reaction product was ground by a grinder and washed with acetone. The obtained polymer had an $\eta sp/C$ of 0.83.

EXAMPLE 1 to 3

The polymer obtained in Reference Example 1 and a polyarylate (U-Polymer (trade name) of Unitika Ltd.) were dissolved in dichloromethane in a weight ratio shown in the table below to prepare a 10 wt % dope (light transmittance: 86.5%, 86.5% or 88.0%, measurement wavelength of 450 nm), and the dope was cast on a glass plate and dried at 150° C. to obtain a transparent uniform film. The physical properties of the obtained film are shown in Table 1.

TABLE 1

| | film thickness | blend composition | light transmittance (%) at the following measurement wavelength (value $\alpha$) | | | | Tg (1) | moisture absorption |
|---|---|---|---|---|---|---|---|---|
| | $\mu m$ | (weight ratio) | 500 to 800 nm | 450 nm | 400 nm | YI | ° C. | coefficient (%) |
| Ex. 1 | 50 | polyarylate/polyimide = 8/2 | 88.1 ($\alpha$ = 25) | 86.5 ($\alpha$ = 29) | 84.5 ($\alpha$ = 34) | 1.9 | 224 | 0.16 |
| Ex. 2 | 48 | polyarylate/polyimide = 5/5 | 88.5 ($\alpha$ = 25) | 86.5 ($\alpha$ = 30) | 83.7 ($\alpha$ = 37) | 2.7 | 276 | 0.26 |
| Ex. 3 | 56 | polyarylate/polyimide = 2/8 | 88.8 ($\alpha$ = 21) | 88.0 ($\alpha$ = 23) | 83.5 ($\alpha$ = 32) | 3.4 | 312 | 0.81 |

Ex.: Example

REFERENCE EXAMPLE 2

195.6 g (1.15 mols) of isophorone diamine, 200.4g (0.92 mol) of pyromellitic anhydride, 68.0 g (0.46 mol) of phthalic anhydride and a mixed solution consisting of 2.7 liters of benzyl alcohol/0.3 liter of toluene as a solvent were heated at 180° C. in a 5-liter separable flask equipped with a Dean and Stark unit, cooling tube, stirrer and nitrogen introduction tube to carry out polymerization and ring-closing reactions while distilling water was removed to the outside of a system by the Dean and Stark unit. The amount of the distilling water was 41.4 ml which was the theoretical amount. The reaction solution was maintained at the same temperature for 0.5 hour and left to be cooled, and a mixed solution of acetone/water (20/1 (v/v)) was added to the reaction solution while the reaction solution was violently stirred when the temperature of the reaction solution was reduced to room temperature to carry out re-precipitation. The reaction product was washed with acetone and dried to obtain a polymer. The obtained polymer had an [η] of 0.10.

REFERENCE EXAMPLES 3 and 4

Polymerization was carried out in the same manner as in Reference Example 2 except that the ratio of isophorone diamine to pyromellitic anhydride was changed as shown in Table 3 to obtain polyimides having an [η] of 0.07 and an [η] of 0.09.

TABLE 2

|  | isophorone diamine (mol) | pyromellitic anhydride (mol) | phthalic anhydride (mol) | [η] |
|---|---|---|---|---|
| R.Ex. 2 | 1.0 | 0.80 | 0.40 | 0.10 |
| R.Ex. 3 | 1.0 | 0.56 | 0.88 | 0.07 |
| R.Ex. 4 | 1.0 | 0.72 | 0.56 | 0.09 |

R.Ex.: Reference Example

EXAMPLE 4

A 20 wt % dichloromethane solution comprising amorphous polyarylate (U-100 of Unitika Ltd.) and the polyimide obtained in Reference Example 2 ([η] of 0.10) in a weight ratio of 90/10 was prepared (light transmittance of 83.9% at a measurement wavelength of 450 nm), dichloromethane was distilled off, and the solution was dried to obtain a transparent blend resin. This resin composition had a Tg of 201.4° C. and an η* of 6,119 P at a shearing speed of 1,000 s$^{-1}$.

EXAMPLE 5

A 20 wt % dichloromethane solution comprising amorphous polyarylate (U-100 of Unitika Ltd.) and the polyimide obtained in Reference Example 3 ([η] of 0.07) in a weight ratio of 90/10 was prepared (light transmittance of 80.9% at a measurement wavelength of 450 nm), dichloromethane was distilled off, and the solution was dried to obtain a transparent blend resin. This resin composition had a Tg of 182.5° C. and an η* of 3,646 P at a shearing speed of 1,000 S$^{-1}$.

EXAMPLE 6

A 20 wt % dichloromethane solution comprising amorphous polyarylate (U-100 of Unitika Ltd.) and the polyimide obtained in Reference Example 4 ([η] of 0.09) in a weight ratio of 90/10 was prepared (light transmittance of 80.4% at a measurement wavelength of 450 nm), dichloromethane was distilled off, and the solution was dried to obtain a transparent blend resin. This resin composition had a Tg of 193.5° C. and an η* of 4,572 P at a shearing speed of 1,000 s$^{-1}$.

COMPARATIVE EXAMPLE 1

A 20 wt % dichloromethane solution of amorphous polyarylate (U-100 of Unitika Ltd.) was prepared, dichloromethane was distilled off, and the solution was dried to obtain a transparent blend resin. This resin composition had a Tg of 189.3° C. and an η* of 5,709P at a shearing speed of 1,000 s$^{-1}$.

COMPARATIVE EXAMPLE 2

A 20 wt % dichloromethane solution comprising amorphous polyarylate (U-100 of Unitika Ltd.) and a polyether imide (Ultem (trade name) of GE Co., Ltd.) in a weight ratio of 90/10 was prepared (light transmittance of 12.3% at a measurement wavelength of 450 nm), dichloromethane was distilled off, and the solution was dried to obtain a pearl-like blend resin. This resin composition had two Tg's of 190.5° C. and 208.8° C. and an η* of 5,443P at a shearing speed of 1,000 s$^{-1}$. The physical properties of the resin composition are shown in Table 3.

TABLE 3

| | film thickness | blend composition | polyimide | Tg (2) | melt viscosity | light transmittance (%) at the following measurement wavelength (value α) | | |
|---|---|---|---|---|---|---|---|---|
| | μm | (weight ratio) | in use | ° C. | (η*) (P) | 500 to 800 nm | 450 nm | 400 nm |
| Ex. 4 | 120 | polyarylate/polyimide = 90/10 | R. Ex. 2 | 201 | 5119 | 90.0 (α = 9) | 88.0 (α = 11) | 80.9 (α = 18) |
| Ex. 5 | 120 | polyarylate/polyimide = 90/10 | R. Ex. 3 | 183 | 3646 | 87.7 (α = 11) | 85.0 (α = 14) | 80.1 (α = 18) |
| Ex. 6 | 120 | polyarylate/polyimide = 90/10 | R. Ex. 4 | 191 | 4572 | 84.0 (α = 15) | 80.4 (α = 18) | 73.2 (α = 26) |
| C. Ex. 1 | 120 | polyarylate | — | 192 | 5709 | 86.5 (α = 12) | 85.2 (α = 13) | 84.4 (α = 14) |
| C. Ex. 2 | 120 | polyarylate/polyether imide = 90/10 | — | 192 211 | 5443 | 80.7 (α = 18) | 78.0 (α = 21) | 60.4 (α = 42) |

Ex.: Example
C. Ex.: Comparative Example
R. Ex.: Reference Example

REFERENCE EXAMPLE 5

221 g (1.3 mols) of isophoronediamine, 283 g (1.3 mols) of pyromellitic anhydride and a mixed solution consisting of 2 liters of benzyl alcohol/0.5 liter of toluene as a solvent were heated at 180° C. in a 5-liter separable flask equipped with a Dean and Stark unit, cooling tube, stirrer and nitrogen introduction tube to carry out polymerization and ring-closing reactions while distilling water was removed to the outside of a system by the Dean and Stark unit. The amount of the distilling water was 47 ml which was the theoretical amount. The reaction solution was maintained at the same temperature for 1 hour, left to be cooled and added to water when the temperature of the reaction solution was reduced to 80° C., and the reaction product was ground by a grinder and washed with acetone to obtain a polyimide having an ηsp/C of 0.94.

REFERENCE EXAMPLE 6

194 g (0.5 mol) of diphenyl 2,6-naphthalene dicarboxylate, 118 g (0.5 mol) of diphenyl carbonate and 240 g (1.0 mol) of bisphenol A were molten at 260° C. in the presence of a dibutyltin diacetate catalyst in a polymerizer equipped with a stirrer and vacuum distillation system and heated at 340° C. while the pressure was gradually reduced to polymerize a polyester carbonate. The obtained polyester carbonate had an ηsp/C of 1.20.

EXAMPLE 7

The polyimide obtained in Reference Example 5 and the polyester carbonate obtained in Reference Example 6 were dissolved in dichloromethane in a weight ratio of 5/5 to prepare a 10 wt % polymer solution (light transmittance of 83.1% at a measurement wavelength of 450 nm), cast on a glass plate and dried at 150° C. to obtain a transparent uniform film. The physical properties of the obtained film are shown in Table 4.

TABLE 4

|  | film thickness | blend composition | water absorption coefficient | light transmittance (%) at the following measurement wavelength (value α) | | | YI | Tg (1) |
|---|---|---|---|---|---|---|---|---|
|  | μm | (weight ratio) | % | 500 to 800 nm* | 450 nm* | 400 nm* |  | ° C. |
| Ex. 7 | 70 | polyester carbonate/ polyimide = 5/5 | 1.6 | 90.0 (α = 15) | 83.1 (α = 26) | 53.3 (α = 90) | 7.9 | 278 |
| C. Ex. 3 | 50 | polyester carbonate (described in Reference Example 6) | 0.80 | 88.6 (α = 24) | 88.0 (α = 26) | 75.5 (α = 40) | 5.0 | 195 |
| C. Ex. 4 | 50 | polyimide (following structural formula (5)) | 3.21 | 6.0 (α = 563) (measured at 500 nm) | 0.0 (α = ∞) | 0.0 (α = ∞) | 135 | 400< |

Ex.: Example
C. Ex.: Comparative Example
*measurement wavelength (5)

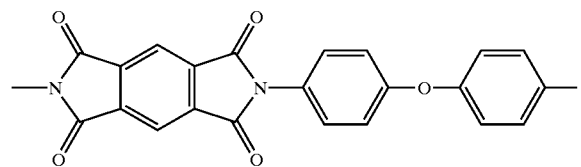

REFERENCE EXAMPLE 7

1,403 g (7.0 mols) of 1,12-dodecamethylene diamine, 1,489 g (6.825 mols) of pyromellitic anhydride, 51.8 g (0.35 mol) of phthalic anhydride and a mixed solution consisting of 21 liters of N-methylpyrrolidone/9 liters of toluene as a solvent were heated at 160° C. in a 50-liter separable flask equipped with a Dean and Stark unit, cooling tube, stirrer and nitrogen introduction tube to carry out polymerization and ring-closing reactions while distilling water was removed to the outside of a system by the Dean and Stark unit so as to synthesize a polyimide. The amount of the distilling water was 252 ml which was the theoretical amount. The reaction solution was maintained at the same temperature for 4 hour and cooled to room temperature, and the precipitated polymer was separated by filtration. This polymer was washed with acetone and hot water and dried at 120° C. for 1 day. The obtained polymer had an [η] of 1.1.

REFERENCE EXAMPLE 8

100 parts of isophthalic acid, 80 parts of hydroquinone, 30 parts of 4,4'-dihydroxydiphenyl, 100 parts of phenol and 0.05 part of antimony trioxide were charged into a reaction system equipped with a stirrer and distillation system and heated at 280° C. under nitrogen pressure. While the pressure was gradually reduced from 5 kg/cm$^2$ to 2 kg/cm$^2$ and water formed by a reaction was distilled off to the outside of the system, the reaction was carried out for 5 hours. 23 parts of water was formed during this. Thereafter, the reaction was continued for 60 minutes by returning the reaction system to normal pressure and distilling off a volatile component under a nitrogen gas stream. The reaction temperature was raised from 280° C. to 340° C. during this.

The reaction was further carried out for 50 minutes by gradually setting the inside pressure of the system to a vacuum level and to about 0.5 mmHg after 60 minutes to obtain a polymer having an [η] of 0.84.

EXAMPLE 8

10 parts by weight of the polyimide obtained in Reference Example 7 and 90 parts by weight of the polyarylate obtained in Reference Example 8 were dissolved in a mixed solvent of phenol/2,4,6-trichlorophenol (weight ratio of 6/4) to prepare a 5 wt % dope (light transmittance of 88.0% at a measurement wavelength of 450 nm) and the dope was diluted with methanol to precipitate crystals which were then filtered, washed with methanol three times and dried at 150° C. with a vacuum drier. The physical properties of the obtained resin composition are shown in Table 5.

COMPARATIVE EXAMPLE 5

The polyarylate obtained in Reference Example 8 was dissolved in a mixed solvent of phenol/2,4,6-trichlorophenol (weight ratio of 6/4) to prepare a 5 wt % dope and the dope was diluted with methanol to precipitate crystals which were then filtered, washed with methanol three times and dried at 150° C. with a vacuum drier. The physical properties of the obtained resin composition are shown in Table 5.

TABLE 5

|        | MFR(g/10 min) | Tmc (° C.) |
|--------|---------------|------------|
| Ex. 8  | 2,431         | 279.7      |
| C.Ex. 5| 75.89         | 278.5      |

REFERENCE EXAMPLE 9

100 parts of isophthalic acid, 85 parts of hydroquinone, 20 parts of neopentyl glycol, 100 parts of phenol and 0.05 part of antimony trioxide were charged into a reaction system equipped with a stirrer and distillation system and heated at 280° C. under nitrogen pressure. While the pressure was gradually reduced from 5 kg/cm$^2$ to 2 kg/cm$^2$ and water formed by a reaction was distilled off to the outside of a system, the reaction was carried out for 5 hours. 24 parts of water was formed during this. Thereafter, the reaction was continued for 60 minutes by returning the reaction system to normal pressure and distilling off a volatile component under a nitrogen gas stream,. The reaction temperature was raised from 280° C. to 340° C. during this.

The reaction was further carried out for 50 minutes by gradually setting the inside pressure of the system to a vacuum level and to about 0.4 mmHg after 60 minutes to obtain a polymer having an [η] of 0.61.

EXAMPLE 9

10 parts by weight of the polyimide obtained in Reference Example 7 and 90 parts by weight of the polyarylate obtained in Reference Example 9 were dissolved in a mixed solvent of phenol/2,4,6-trichlorophenol (weight ratio of 6/4) to prepare a 5 wt % dope (light transmittance of 87.0% at a measurement wavelength of 450 nm) and the dope was diluted with methanol to precipitate crystals which were then filtered, washed with methanol three times and dried at 150° C. with a vacuum drier. The physical properties of the obtained resin composition are shown in Table 6.

COMPARATIVE EXAMPLE 6

The polyarylate obtained in Example 8 was dissolved in a mixed solvent of phenol/2,4,6-trichlorophenol (weight ratio of 6/4) to prepare a 5 wt % dope and the dope was diluted with methanol to precipitate crystals which were then filtered, washed with methanol three times and dried at 150° C. with a vacuum drier. The physical properties of the obtained resin composition are shown in Table 6.

TABLE 6

|        | MFR(g/10 min) | Tmc (° C.) |
|--------|---------------|------------|
| Ex. 9  | 1,236         | 281.5      |
| C.Ex. 6| 74.13         | 276.0      |

REFERENCE EXAMPLE 10

100 parts of isophthalic acid, 77 parts of hydroquinone, 33 parts of bisphenol A, 100 parts of phenol and 0.05 part of antimony trioxide were charged into a reaction system equipped with a stirrer and distillation system and heated at 280° C. under nitrogen pressure. While the pressure was gradually reduced from 5 kg/cm$^2$ to 2 kg/cm$^2$ and water formed by a reaction was distilled off to the outside of a system, the reaction was carried out for 5 hours. 22.5 parts of water was formed during this. Thereafter, the reaction was continued for 60 minutes by returning the reaction system to normal pressure and distilling off a volatile component under a nitrogen gas stream. The reaction temperature was raised from 280° C. to 340° C. during this.

The reaction was further carried out for 50 minutes by gradually setting the inside pressure of the system to a vacuum level and to about 0.4 mmHg after 60 minutes to obtain apolymer having an [η] of 0.61.

EXAMPLE 10

10 parts by weight of the polyimide obtained in Reference Example 3 and 90 parts by weight of the polyarylate obtained in Reference Example 10 were dissolved in a mixed solvent of phenol/2,4,6-trichlorophenol (weight ratio of 6/4) to prepare a 5 wt % dope and the dope was diluted with methanol to precipitate crystals which were then filtered, washed with methanol three times and dried at 150° C. with a vacuum drier. The physical properties of the obtained resin composition are shown in Table 7.

EXAMPLE 11

The procedure of Example 10 was repeated to obtain a composition except that the polyimide obtained in Reference Example 4 was used in place of the polyimide obtained in Reference Example 3. The physical properties of the obtained resin composition are shown in Table 7.

COMPARATIVE EXAMPLE 7

The polyarylate obtained in Reference Example 10 was dissolved in a mixed solvent of phenol/2,4,6-trichlorophenol (weight ratio of 6/4) to prepare a 5 wt % dope and the dope was diluted with methanol to precipitate crystals which were then filtered, washed with methanol three times and dried at 150° C. with a vacuum drier. The physical properties of the obtained resin composition are shown in Table 7.

TABLE 7

|        | polymer composition (weight ratio) | polyimide in use | Tg ° C. | melt viscosity (η*) (P) |
|--------|------------------------------------|------------------|---------|--------------------------|
| Ex. 10 | polyarylate/polyimide = 90/10      | R.Ex. 3          | 171     | 2624                     |
| Ex. 11 | polyarylate/polyimide = 90/10      | R.Ex. 4          | 178     | 3290                     |
| C.Ex. 7| polyarylate                        | —                | 179     | 4108                     |

Ex.: Example
C.Ex.: Comparative Example
R.Ex.: Reference Example

What is claimed is:

1. A resin composition comprising:
   (A) a polyimide comprising a recurring unit represented by the following formula (1):

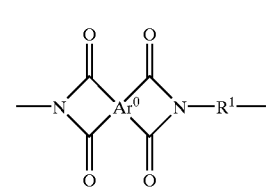

wherein Ar$^0$ is an aromatic hydrocarbon group having 6 to 15 carbon atoms represented by the following formula:

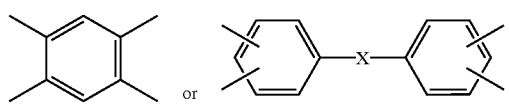

wherein X is a single bond, sulfonyl group, alkylene group having 1 to 3 carbon atoms or haloalkylene group having 1 to 3 carbon atoms, and $R^1$ is at least one group selected from the group consisting of a divalent residual group obtained by removing two amino groups from an aliphatic diamine having 2 to 30 carbon atoms and a divalent residual group obtained by removing two amino groups from an alicyclic diamine having 4 to 30 carbon atoms, and (B) at least one polymer selected from the group consisting of a polyarylate comprising at least one recurring unit selected from the group consisting of a recurring unit represented by the following formula (2-1):

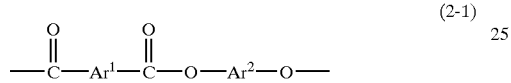

(2-1)

wherein $Ar^1$ is an aromatic hydrocarbon group having 6 to 18 carbon atoms and $Ar^2$ is an aromatic hydrocarbon group having 6 to 30 carbon atoms or a combination of the aromatic hydrocarbon group and an aliphatic hydrocarbon group having 2 to 10 carbon atoms, and a recurring unit represented by the following formula (2-2):

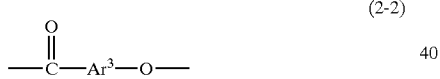

(2-2)

wherein $Ar^3$ is an aromatic hydrocarbon group having 6 to 18 carbon atoms, and a polyester carbonate comprising at least one of the above recurring units and a recurring unit represented by the following formula (2-3):

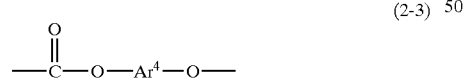

(2-3)

wherein $Ar^4$ is an aromatic hydrocarbon group having 6 to 30 carbon atoms, the amount of the polyimide (A) being 0.05 to 99.95 wt % and the amount of the polymer (B) being 99.95 to 0.05 wt % based on the total weight of the polyimide (A) and the polymer (B).

2. The resin composition of claim 1, wherein in the above formula (1), the divalent residual group obtained by removing two amino groups from an aliphatic diamine having 2 to 30 carbon atoms is represented by the following formula:

—(CH$_2$)$_n$— where n is a number of 2 to 30, or by the following formula:

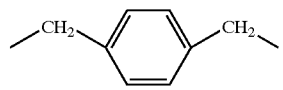

3. The resin composition of claim 1, wherein in the above formula (1), the divalent residual group obtained by removing two amino groups from an alicyclic diamine having 4 to 30 carbon atoms is represented by the following formula:

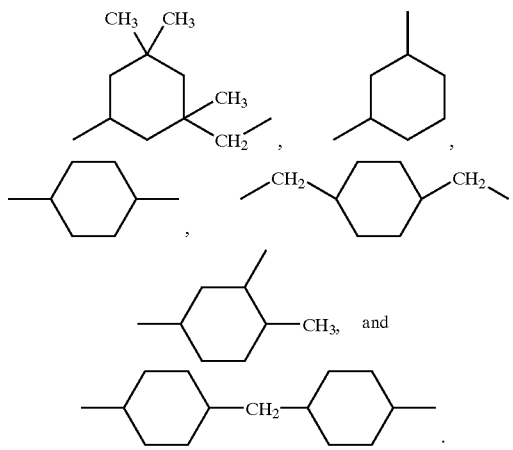

4. The resin composition of claim 1, wherein the polyimide comprises a recurring unit represented by the following formula (1)-1:

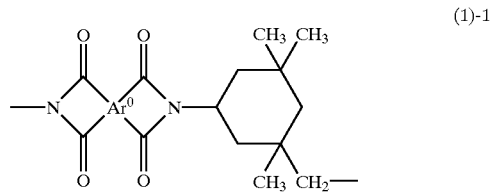

(1)-1 wherein $Ar^0$ is as defined in the above formula (1).

5. The resin composition of claim 4, wherein the polyimide comprises a recurring unit represented by the following formula (1)-1-1:

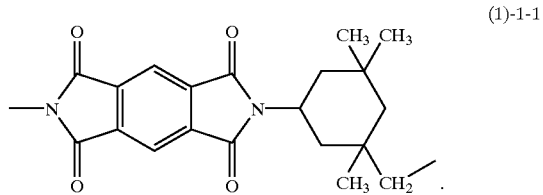

(1)-1-1

6. The resin composition of claim 1, wherein the polyimide comprises a recurring unit represented by the following formula (1)-2:

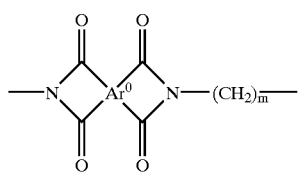

(1)-2 wherein Ar⁰ is as defined in the above formula (1) and m is an integer of 9 to 12.

7. The resin composition of claim 6, wherein the polyimide comprises a recurring unit represented by the following formula (1)-2-1:

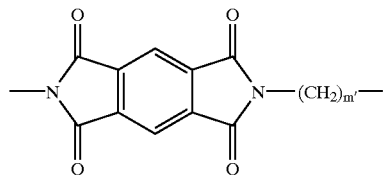

(1)-2-1 wherein m' is 10 and/or 12.

8. The resin composition of claim 1, wherein in the above formula (2-1), the aromatic hydrocarbon group having 6 to 18 carbon atoms represented by $Ar^1$ is a group represented by the following formula:

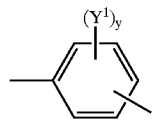

wherein $Y^1$ is a group selected from the group consisting of an aliphatic hydrocarbon group having 1 to 6 carbon atoms, alicyclic hydrocarbon group having 6 to 12 carbon atoms and halogen atom, and y is a number of 0 to 4, with the proviso that when y is 2 to 4, $Y^1$'s may be the same or different, and/or a group represented by the following formula:

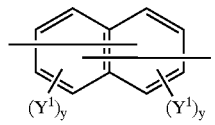

wherein $Y^1$ and y are as defined hereinabove, with the proviso that $Y^1$'s may be the same or different and the total of two Y's is not larger than 6.

9. The resin composition of claim 8, wherein in the above formula (2-1), the aromatic hydrocarbon group having 6 to 18 carbon atoms represented by $Ar^1$ is 1,4-phenylene, 1,3-phenylene, 2,6-naphthylene, 2,7-naphthylene or 2,3-naphthylene.

10. The resin composition of claim 1, wherein in the above formula (2-1), the aromatic hydrocarbon group having 6 to 30 carbon atoms represented by $Ar^2$ is a group represented by the following formula:

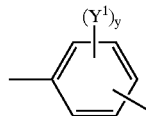

wherein $Y^1$ is a group selected from the group consisting of an aliphatic hydrocarbon group having 1 to 6 carbon atoms, alicyclic hydrocarbon group having 6 to 12 carbon atoms and halogen atom, and y is a number of 0 to 4, with the proviso that when y is 2 to 4, $Y^1$'s may be the same or different, and/or a group represented by the following formula:

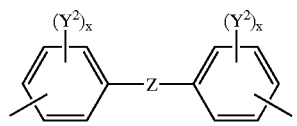

wherein Z is a group selected from the group consisting of a single bond, ether bond, carbonyl group, sulfonyl group, aliphatic hydrocarbon group having 1 to 10 carbon atoms, haloaliphatic hydrocarbon group having 1 to 10 carbon atoms, alicyclic hydrocarbon group having 6 to 10 carbon atoms and haloalicyclic hydrocarbon group having 6 to 10 carbon atoms, $Y^2$'s are each independently an aliphatic hydrocarbon group having 1 to 6 carbon atoms, alicyclic hydrocarbon group having 6 to 12 carbon atoms or halogen atom, and x's are each independently a number of 0 to 4.

11. The resin composition of claim 1, wherein in the above formula (2-1), the aliphatic hydrocarbon group having 2 to 10 carbon atoms represented by $Ar^2$ does not have a tertiary carbon atom.

12. The resin composition of claim 1, wherein in the above formula (2-2), the aromatic hydrocarbon group having 6 to 18 carbon atoms represented by $Ar^3$ is a group represented by the following formula:

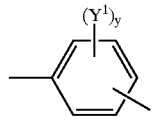

wherein $Y^1$ is a group selected from the group consisting of an aliphatic hydrocarbon group having 1 to 6 carbon atoms, alicyclic hydrocarbon group having 6 to 12 carbon atoms and halogen atom, and y is a number of 0 to 4, with the proviso that when y is 2 to 4, $Y^1$'s may be the same or different.

13. The resin composition of claim 12, wherein the aromatic hydrocarbon group having 6 to 18 carbon atoms represented by $Ar^3$ is a 1,4-phenylene group.

14. The resin composition of claim 1, wherein in the above formula (2-3), the aromatic hydrocarbon group having 6 to 30 carbon atoms represented by $Ar^4$ is a group represented by the following formula:

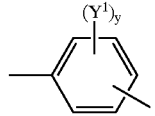

wherein $Y^1$ is a group selected from the group consisting of an aliphatic hydrocarbon group having 1 to 6 carbon atoms, alicyclic hydrocarbon group having 6 to 12 carbon atoms and halogen atom, and y is a number of 0 to 4, with the proviso that when y is 2 to 4, Y¹'s may be the same or different, and/or a group represented by the following formula:

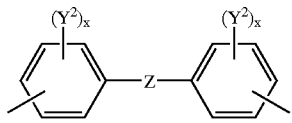

wherein Z is a group selected from the group consisting of a single bond, ether bond, carbonyl group, sulfonyl group, aliphatic hydrocarbon group having 1 to 10 carbon atoms, haloaliphatic hydrocarbon group having 1 to 10 carbon atoms, alicyclic hydrocarbon group having 6 to 10 carbon atoms and haloalicyclic hydrocarbon group having 6 to 10 carbon atoms, $Y^2$'s are each independently an aliphatic hydrocarbon group having 1 to 6 carbon atoms, alicyclic hydrocarbon group having 6 to 12 carbon atoms or halogen atom, and x's are each independently a number of 0 to 4.

15. The resin composition of claim 1, wherein the polyimide (A) comprises a recurring unit represented by the following formula (1)-1:

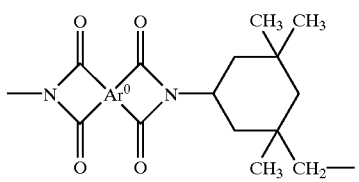

wherein $Ar^0$ is as defined in the above formula (1), and the polymer (B) is a polyarylate comprising a recurring unit represented by the following formula (2-1)-1:

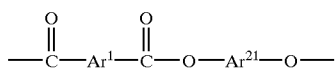

wherein $Ar^1$ is as defined in the above formula (2-1) and $Ar^{21}$ is at least one group selected from groups represented by the following formula:

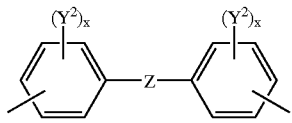

wherein Z is a group selected from the group consisting of a single bond, ether bond, carbonyl group, sulfonyl group, aliphatic hydrocarbon group having 1 to 10 carbon atoms, haloaliphatic hydrocarbon group having 1 to 10 carbon atoms, alicyclic hydrocarbon group having 6 to 10 carbon atoms and haloalicyclic hydrocarbon group having 6 to 10 carbon atoms, $Y^2$'s are each independently an aliphatic hydrocarbon group having 1 to 6 carbon atoms, alicyclic hydrocarbon group having 6 to 12 carbon atoms or halogen atom, and x's are each independently a number of 0 to 4.

16. The resin composition of claim 15, wherein the polyarylate comprises a recurring unit represented by the following formula (2-1)-2:

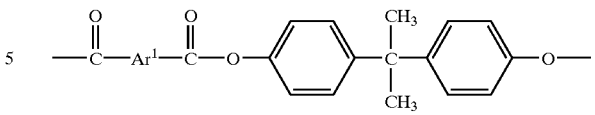

wherein $Ar^1$ is as defined in the above formula (2-1).

17. The resin composition of claim 16, wherein in the above formula (2-1)-2, $Ar^1$ is a 1,4-phenylene group and/or 1,3-phenylene group.

18. The resin composition of claim 1, wherein the polyimide (A) comprises a recurring unit represented by the following formula (1)-1:

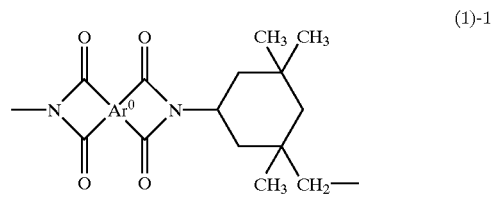

wherein $Ar^0$ is as defined in the above formula (1), and the polymer (B) is a polyester carbonate comprising a recurring unit represented by the following formula (2-1)-1':

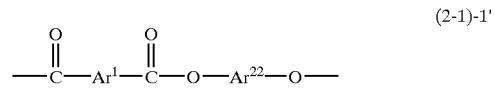

wherein $Ar^1$ is as defined in the above formula (2-1) and $Ar^{22}$ is a group represented by the following formula:

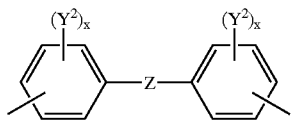

wherein Z is a group selected from the group consisting of a single bond, ether bond, carbonyl group, sulfonyl group, aliphatic hydrocarbon group having 1 to 10 carbon atoms, haloaliphatic hydrocarbon group having 1 to 10 carbon atoms, alicyclic hydrocarbon group having 6 to 10 carbon atoms and haloalicyclic hydrocarbon group having 6 to 10 carbon atoms, $Y^2$'s are each independently an aliphatic hydrocarbon group having 1 to 6 carbon atoms, alicyclic hydrocarbon group having 6 to 12 carbon atoms or halogen atom, and x's are each independently a number of 0 to 4, and a recurring unit represented by the following formula (2-3)-1:

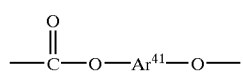

wherein $Ar^{41}$ is a group represented by the following formula:

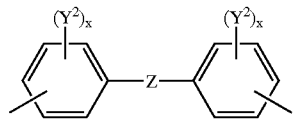

wherein Z is a group selected from the group consisting of a single bond, ether bond, carbonyl group, sulfonyl group, aliphatic hydrocarbon group having 1 to 10 carbon atoms, haloaliphatic hydrocarbon group having 1 to 10 carbon atoms, alicyclic hydrocarbon group having 6 to 10 carbon atoms and haloalicyclic hydrocarbon group having 6 to 10 carbon atoms, $Y^2$'s are each independently an aliphatic hydrocarbon group having 1 to 6 carbon atoms, alicyclic hydrocarbon group having 6 to 12 carbon atoms or halogen atom, and x's are each independently a number of 0 to 4.

19. The resin composition of claim 18, wherein the polyester carbonate comprises a recurring unit represented by the following formula (2-1)-2:

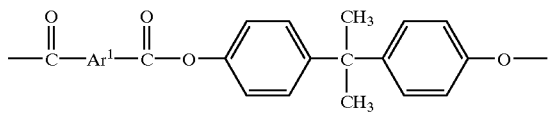

(2-1)-2 wherein $Ar^1$ is as defined in the above formula (2-1), and a recurring unit represented by the following formula (2-3)-1':

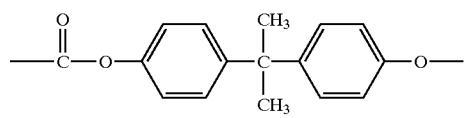

(2-3)-1'

20. The resin composition of claim 19, wherein in the above formula (2-1)-2, $Ar^1$ is a 2,6-naphthylene group.

21. The resin composition of claim 15 or 16, wherein the polyimide (A) and the polymer (B) are soluble in a solvent selected from the group consisting of a hydrocarbon halide solvent, cyclic ether solvent, amide solvent, sulfoxide solvent, phenol solvent and mixed solvent thereof.

22. The resin composition of claim 1, wherein the polyimide (A) comprises a recurring unit represented by the following formula (1)-4:

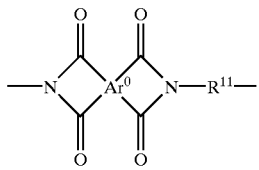

(1)-4 wherein $Ar^0$ is as defined in the above formula (1) and $R^{11}$ is a group represented by the following formula:

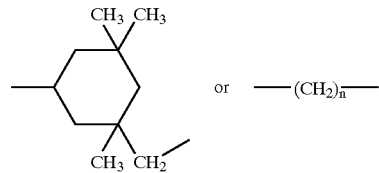

wherein n is a number of 2 to 30, and the polymer (B) is a polyarylate comprising a recurring unit represented by the following formula (2-1)-1:

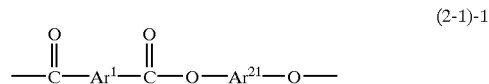

(2-1)-1 wherein $Ar^1$ is as defined in the above formula (2-1) and $Ar^{21}$ is a group selected from a group represented by the following formula:

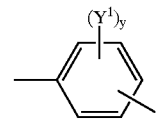

wherein $Y^1$ is a group selected from the group consisting of an aliphatic hydrocarbon group having 1 to 6 carbon atoms, alicyclic hydrocarbon group having 6 to 12 carbon atoms and halogen atom, and y is a number of 0 to 4, with the proviso that when y is 2 to 4, $Y^1$'s may be the same or different, and a group represented by the following formula:

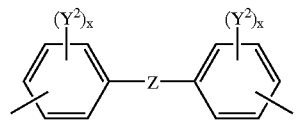

wherein Z is a group selected from the group consisting of a ether bond, carbonyl group, sulfonyl group, aliphatic hydrocarbon group having 1 to 10 carbon atoms, haloaliphatic hydrocarbon group having 1 to 10 carbon atoms, alicyclic hydrocarbon group having 6 to 10 carbon atoms and haloalicyclic hydrocarbon group having 6 to 10 carbon atoms, $Y^2$'s are each independently an aliphatic hydrocarbon group having 1 to 6 carbon atoms, alicyclic hydrocarbon group having 6 to 12 carbon atoms or halogen atom, and x's are each independently a number of 0 to 4.

23. The resin composition of claim 22, wherein the polyarylate comprises a recurring unit represented by the following formula (2-1)-2:

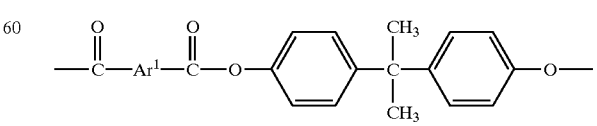

(2-1)-2 wherein $Ar^1$ is as defined in the above formula (2-1), and a recurring unit represented by the following formula (2-1)-3:

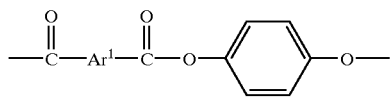

(2-1)-3 wherein Ar¹ is as defined in the above formula (2-1).

24. The resin composition of claim 23, wherein in the above formulas (2-1)-2 and (2-1)-3, Ar¹ is a 1,3-phenylene group.

25. The resin composition of claim 1, wherein the polyimide (A) comprises a recurring unit represented by the following formula (I)-3:

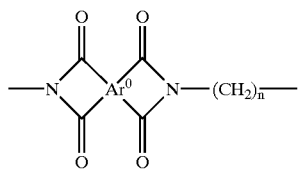

(1)-3 wherein Ar⁰ is as defined in the above formula (I) and n is a number of 2 to 30, and the polymer (B) is a polyarylate comprising a recurring unit represented by the following formula (2-1)-4:

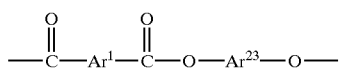

(2-1)-4 wherein Ar¹ is as defined in the above formula (2-1) and Ar²³ is a group selected from a group represented by the following formula:

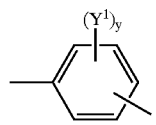

wherein Y¹ is a group selected from the group consisting of an aliphatic hydrocarbon group having 1 to 6 carbon atoms, alicyclic hydrocarbon group having 6 to 12 carbon atoms and halogen atom, and y is a number of 0 to 4, with the proviso that when y is 2 to 4, Y¹'s may be the same or different, and a group represented by the following formula:

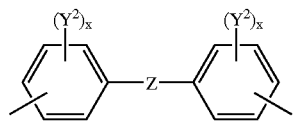

wherein Z is a group selected from the group consisting of a single bond, ether bond, carbonyl group, sulfonyl group, aliphatic hydrocarbon group having 1 to 10 carbon atoms, haloaliphatic hydrocarbon group having 1 to 10 carbon atoms, alicyclic hydrocarbon group having 6 to 10 carbon atoms and haloalicyclic hydrocarbon group having 6 to 10 carbon atoms, Y²'s are each independently an aliphatic hydrocarbon group having 1 to 6 carbon atoms, alicyclic hydrocarbon group having 6 to 12 carbon atoms or halogen atom, and x's are each independently a number of 0 to 4.

26. The resin composition of claim 25, wherein the polyarylate comprises a recurring unit represented by the following formula (2-1)-5:

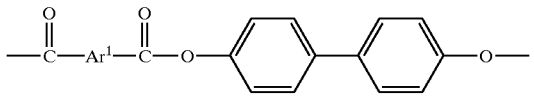

(2-1)-5 wherein Ar¹ is as defined in the above formula (2-1), and a recurring unit represented by the following formula (2-1)-6:

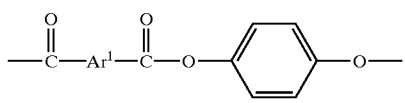

(2-1)-6 wherein Ar¹ is as defined in the above formula (2-1).

27. The resin composition of claim 26, wherein in the above formulas (2-1)-5 and (2-1)-6, Ar¹ is a 1,3-phenylene group.

28. The resin composition of claim 1, wherein the polyimide (A) comprises a recurring unit represented by the following formula (1)-3:

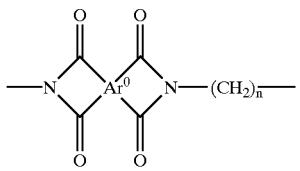

(1)-3 wherein Ar⁰ is as defined in the above formula (1) and n is a number of 2 to 30, and the polymer (B) is a polyarylate comprising a recurring unit represented by the following formula (2-1)-4:

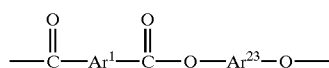

(2-1)-4 wherein Ar¹ is as defined in the above formula (2-1) and Ar²³ is a group represented by the following formula:

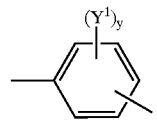

wherein Y¹ is a group selected from the group consisting of an aliphatic hydrocarbon group having 1 to 6 carbon atoms, alicyclic hydrocarbon group having 6 to 12 carbon atoms and halogen atom, and y is a number of 0 to 4, with the proviso that when y is 2 to 4, Y¹'s may be the same or different, and/or a group represented by the following formula:

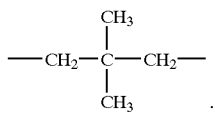

29. The resin composition of claim 28, wherein the polyarylate comprises a recurring unit represented by the following formula (2-1)-7:

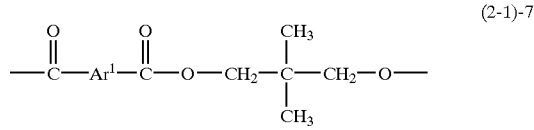
(2-1)-7 wherein Ar$^1$ is as defined in the above formula (2-1), and a recurring unit represented by the following formula (2-1)-6:

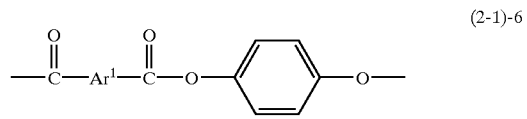
(2-1)-6 wherein Ar$^1$ is as defined in the above formula (2-1).

30. The resin composition of claim 29, wherein in the above formulas (2-1)-7 and (2-1)-6, Ar$^1$ is a 1,3-phenylene group.

31. The resin composition of claim 1, wherein the polyimide (A) and the polymer (B) are compatible with each other.

32. The resin composition of claim 1, wherein the polyimide (A) has an intrinsic viscosity [η] of 0.05 to 12.

33. A molded product of the resin composition of claim 1 or 25.

* * * * *